(12) United States Patent
Fang et al.

(10) Patent No.: US 9,624,092 B1
(45) Date of Patent: Apr. 18, 2017

(54) SEMICONDUCTOR STRUCTURE WITH MICRO-ELECTRO-MECHANICAL SYSTEM DEVICES

(71) Applicant: UNITED MICROELECTRONICS CORP., Hsinchu (TW)

(72) Inventors: Wei-Hua Fang, Kaohsiung (TW); Kuan-Yu Wang, New Taipei (TW); Her-Yi Tang, Taipei (TW); Xuan-Rui Chen, Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/010,426

(22) Filed: Jan. 29, 2016

(51) Int. Cl.
*H01L 23/02* (2006.01)
*H01L 23/06* (2006.01)
*H01L 23/34* (2006.01)
*B81B 3/00* (2006.01)

(52) U.S. Cl.
CPC .... *B81B 3/0086* (2013.01); *B81B 2203/0127* (2013.01); *B81B 2203/0315* (2013.01); *B81B 2203/04* (2013.01); *B81B 2207/015* (2013.01); *B81B 2207/07* (2013.01)

(58) Field of Classification Search
CPC ..... B81B 3/0018; B81B 3/0035; B81B 3/007; B81B 2201/02; B81B 2201/0221; B81B 2201/0271; B81B 2201/0285; B81B 2203/0127; B81B 2203/0315; B81B 2207/01; B81B 2207/015; B81B 2207/053; B81B 2207/07; B81B 2207/09; B81B 2207/097

USPC ........ 257/678, 684, 687, 723, 724; 438/106, 438/107, 109, 117, 125, 126
See application file for complete search history.

(56) References Cited

U.S. PATENT DOCUMENTS

| 7,352,053 B2* | 4/2008 | Chang ................. G02B 6/3584 257/635 |
| 8,525,354 B2 | 9/2013 | Wu et al. |
| 9,018,718 B2 | 4/2015 | Hsu et al. |
| 2011/0148537 A1* | 6/2011 | Watanabe ................ H03B 5/30 331/154 |
| 2016/0119722 A1* | 4/2016 | Chu ..................... H04R 19/005 257/416 |

* cited by examiner

*Primary Examiner* — Hsien Ming Lee
(74) *Attorney, Agent, or Firm* — WPAT, PC; Justin King

(57) ABSTRACT

A semiconductor structure having micro-electro-mechanical system (MEMS) devices is provided. One of the MEMS devices includes a substrate having a first region and a second region; a membrane structure formed in the first region and positioned correspondingly to a cavity of the substrate; a logic device formed in the second region, and electrically connected to the membrane structure; an interconnection structure formed in the second region, and the interconnection structure formed on the substrate and covering the logic device; and an etching stop layer formed in the second region, and the etching stop layer formed on the interconnection structure and including a nitride layer and a carbon-containing layer formed on the nitride layer. Also, a variation in resonant frequencies of the MEMS devices on the entire wafer is less than 10%.

18 Claims, 6 Drawing Sheets

SEMICONDUCTOR STRUCTURE WITH MICRO-ELECTRO-MECHANICAL SYSTEM DEVICES

BACKGROUND

Technical Field

The disclosure relates in general to a semiconductor structure, and more particularly to a semiconductor structure with micro-electro-mechanical system (MEMS) devices.

Description of the Related Art

Micro-electro-mechanical systems (MEMS) are miniature devices which have been widely used in a variety of products with smaller sizes, such as micro-acoustical sensor, a gyro-sensor, an accelerometer or a clock generation and oscillator. Some well-known examples of MEMS-enabled functionality in everyday life are airbag deployment in automobiles; motion and orientation detection in smartphones; and blood pressure measurement in IV lines and catheters. The MEMS device includes mechanical components (such as deformable membranes, vibrating structures, etc.) and electrical components (such as resistors, capacitors, inductors, etc.), which is capable of sensing the physical properties of the environment or performing controlled physical interaction or actuation with the environment.

It is known that the process for fabricating the MEMS devices will cause considerable defects such as oxide loss in the structure, thereby deteriorating the electrical properties and performances of the MEMS devices.

SUMMARY

The disclosure is directed to a semiconductor structure with micro-electro-mechanical system (MEMS) devices, which effectively prevents the defects in the MEMS devices and significantly improves resonant frequencies (RF) uniformity of the MEMS devices on the entire wafer.

According to one aspect of the present disclosure, a semiconductor structure having a plurality of micro-electro-mechanical system (MEMS) devices is provided. One of the MEMS devices includes a substrate having a first region and a second region; a membrane structure formed in the first region and positioned correspondingly to a cavity of the substrate; a logic device formed in the second region, and electrically connected to the membrane structure; an interconnection structure formed in the second region, and the interconnection structure formed on the substrate and covering the logic device; and an etching stop layer formed in the second region, and the etching stop layer formed on the interconnection structure and including a nitride layer and a carbon-containing layer formed on the nitride layer.

According to another aspect of the present disclosure, a semiconductor structure having a plurality of micro-electro-mechanical system (MEMS) devices on a substrate of a wafer is provided. Each of the MEMS devices has an etching stop layer including a nitride layer and a carbon-containing layer formed on the nitride layer, wherein a variation in resonant frequencies of the MEMS devices on the entire wafer is less than 10%.

DETAILED DESCRIPTION

Figure 1:
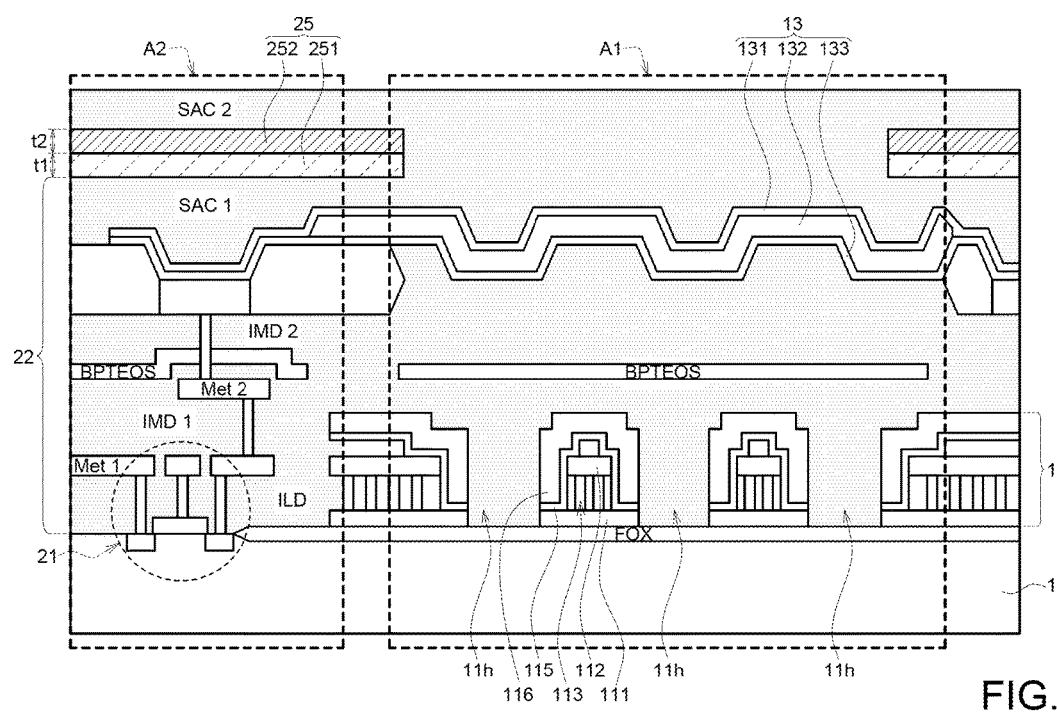
FIG. 1 illustrates a semiconductor structure having a MEMS device, before releasing related layers in the sensing area, according to one embodiment of the present disclosure.

In the embodiments of the present disclosure, a semiconductor structure having micro-electro-mechanical system (MEMS) devices is provided. Configuration of the embodied MEMS device effectively prevents the defects occurring at the passivation layer of the conventional MEMS device, thereby improving the properties and performance of the MEMS device. Also, compared to the conventional MEMS devices, the embodied MEMS devices at the edge area and the center area of a wafer have more uniform thickness. Moreover, the variation in resonant frequencies of the MEMS devices on the entire wafer is greatly decreased. The proposed structure of the present embodiments not only significantly improves the MEMS devices, but also is compatible with the current fabrication process of the MEMS devices, which is suitable for mass production.

Embodiments are provided hereinafter with reference to the accompanying drawings for describing the related procedures and configurations. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1 illustrates a semiconductor structure having a MEMS device, before releasing related layers in the sensing area, according to one embodiment of the present disclosure. In practical application, a semiconductor wafer includes several MEMS devices, but FIG. 1 only schematically shows one MEMS device for the purpose of clear demonstration.

As shown in FIG. 1, a substrate 10 having a first region A1 and a second region A2 is provided. According to the embodiment, the first region A1 is a MEMS region, and the second region A2 is a logic region. The first region A1 comprises a first electrode structure 11 having a plurality of perforated holes 11h, and a membrane structure 13 positioned oppositely to the first electrode structure 11. Accordingly, the membrane structure formed in the first region A1 can be referred as a second electrode structure. In FIG. 1, the first region A1 also contains several films such as the dielectric layers and the passivation layers (such as oxide layers), which would be removed subsequently by a suitable etching procedure such as hydrogen fluoride (HF) etching (so-called as "HF release").

Also, a logic device 21 is formed in the second region A2, and electrically connected to the membrane structure 13. There is an interconnection structure 22 formed in the second region A2, wherein the interconnection structure 22 is formed on the substrate 10 and covers the logic device 21. In the embodiment, an etching stop layer 25 is formed in the second region A2 to prevent the defects typically occurring in the conventional MEMS device. The etching stop layer 25 is formed on the interconnection structure 22, and includes a nitride layer 251 and a carbon-containing layer 252 formed on the nitride layer 251.

Figure 2:
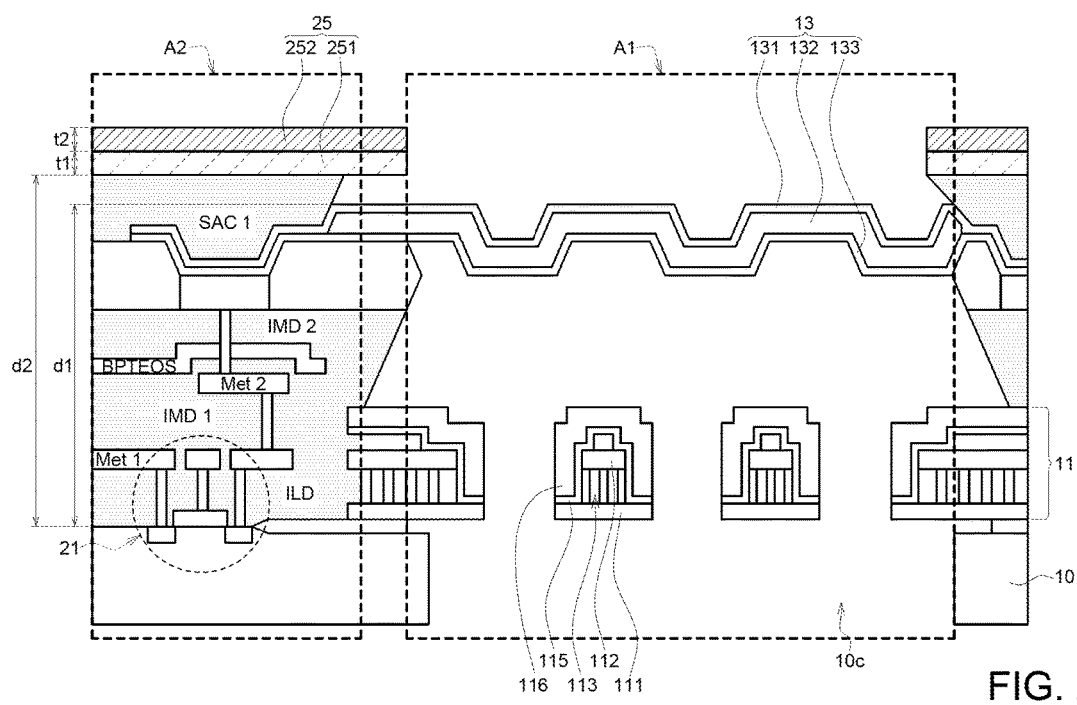
FIG. 2 illustrates a semiconductor structure having a MEMS device, after releasing related layers in the sensing area, according to one embodiment of the present disclosure.

Subsequently, MEMS cavity process is conducted, followed by etching procedure such as HF etching to remove unnecessary films in the MEMS region. For example, the structure as shown in FIG. 1 can be turned upside down and fixed to a tool chuck (ex: in the vacuum condition), and the procedures such as substrate thinning and substrate patterning are performed to form the cavities at the MEMS devices correspondingly. After forming the cavities, the unnecessary films in the MEMS region are removed. FIG. 2 illustrates a semiconductor structure having a MEMS device, after releasing related layers in the sensing area, according to one embodiment of the present disclosure. In FIG. 2, the cavity 10c opens through the substrate 10, and the perforated holes 11h of the first electrode structure 11 are positioned adjacent to the cavity 10c of the substrate 10. The membrane structure 13 is spaced apart from the first electrode structure 11, and positioned correspondingly to the cavity 10c of the substrate 10. The air flow passing through the perforated holes 11h induces vertical displacement of the membrane structure 13.

Other components and layers in the first region A1 and second region A2, such as the dielectric layers (ex: the ILD layer, IMD1 (inter-metal dielectric) layer and IMD2 layer), the metal layers (ex: the Met 1 layer and Met 2 layer), the metal pad and the BPTEOS oxide film, the first and second sacrificial oxide layer SAC 1 and the SAC 2 in the first region A1, and the FOX (field oxide), are illustrated in FIG. 1 and FIG. 2. Also, the first electrode structure 11 including the polysilicon layer 111, the metal layer 112, the contact 113, the first protect layer 115 (ex: TiN/Al/TiN) and the second protect layer 116 (ex: SiN) in the second region A2, are depicted in FIG. 1 and FIG. 2. In FIG. 1, the nitride layer 251 is formed on the first sacrificial oxide layer SAC 1, and a second sacrificial oxide layer SAC 2 is formed on the carbon-containing layer 252. Also, the membrane structure 13 formed in the first region A1 includes three layers such as an oxide layer 132 sandwiched between two conductive layers 131 and 133, wherein each of the conductive layers 131 and 133 can be a multi-layer including materials of TiN/Al/TiN. The details of the configurations and working principles of the known components and layers are not redundantly described herein.

Moreover, the first electrode structure 11 and the membrane structure 13 in the first region A1 are positioned correspondingly between the substrate 10 and the etching stop layer 25 in the second region A2. Accordingly, the membrane structure 13 in the first region A1 is relatively lower than the position of the etching stop layer 25 in the second region A2. As shown in FIG. 2, the vertical distance d2 between the etching stop layer 25 and the substrate 10 is larger than the vertical distance d1 between the membrane structure 13 and the substrate 10.

According to the embodiments, the carbon-containing layer 252 of the etching stop layer 25 is an extremely low HF etching rate stop layer, which is able to prevent the defects occurring at the passivation layer (such as the oxide layer) in the second region A2 after performing the HF etching procedure (i.e. HF release).

In the embodiments, the carbon-containing layer 252 can be made by at least a material of silicon carbide (SiC), silicon oxycarbide (SiOC), or silicon carbonitride (SiCN). In one embodiment, the carbon-containing layer 252 has a thickness t2 ranged from about 200 Å to about 1000 Å, such as 500 Å approximately. The thickness t1 of the nitride layer 251 can be optionally determined according to the practical requirement, such as about 10 k or other numerical values, and nitride layer 251 of the embodiment would not be consumed after HF release (i.e. the thickness t1 is substantially maintained after HF release).

Figure 3:
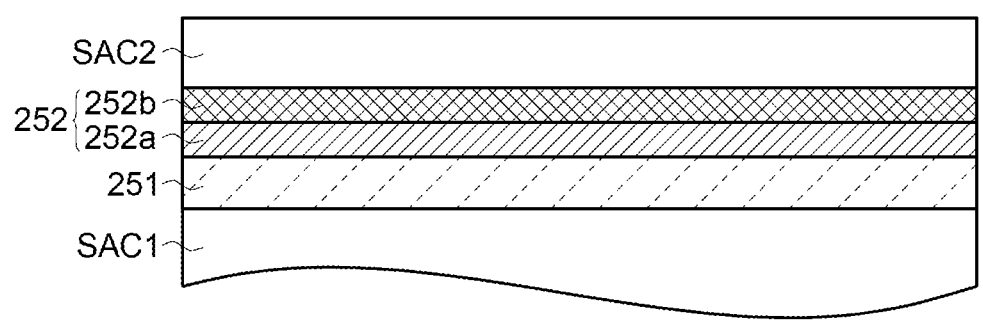
FIG. 3 simply illustrates a portion of an etching stop layer according to one embodiment.

In one embodiment, the nitride layer 251 is a silicon nitride layer, and the carbon-containing layer 252 is a silicon carbide (SiC) layer. However, the carbon-containing layer 252 is not limited to a single layer. In the present disclosure, the carbon-containing layer 252 can be a single layer or a multi-layer. FIG. 3 simply illustrates a portion of an etching stop layer according to one embodiment. In one of the embodiments, the carbon-containing layer 252 may include a silicon carbonitride (SiCN) layer 252a and a silicon carbide (SiC) layer 252b. The SiCN layer 252a can be formed by subjecting a SiN layer (i.e. the nitride layer 251) to a treatment such as the surface treatment. Alternatively, the SiCN layer 252a can be formed by directly deposition on the SiN layer (i.e. the nitride layer 251), and the SiC layer 252b is deposited on the SiCN layer 252a.

Figure 4A:
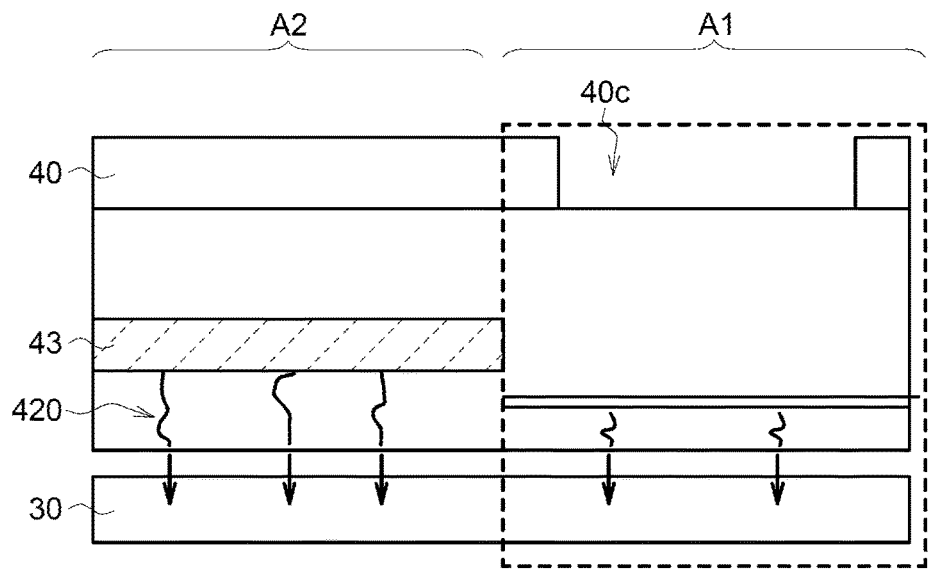
FIG. 4A illustrates oxide cracks generated near the SiN passivation layer in the logic region due to the structure fixation to a tool chuck.
Figure 4B:
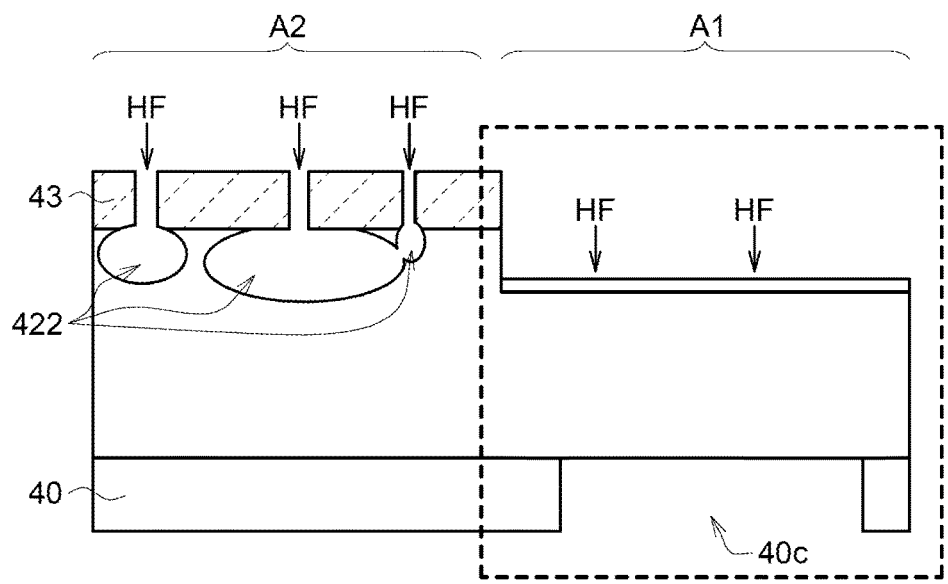
FIG. 4B illustrates the oxide defects occurring in the logic region after HF release.

In the fabrication of the conventional MEMS device, oxide cracks would be generated during the MEMS cavity process. FIG. 4A illustrates oxide cracks 420 generated near the SiN passivation layer 43 in the logic region due to the structure fixation to a tool chuck 30 (ex: in the vacuum condition). After formation of the cavity 40c of the substrate 40, followed by etching procedure such as HF etching to remove unnecessary films in the MEMS region, the HF would permeate into the SiN passivation layer 43 and etch the oxide (ex: starting from the oxide cracks 420) to form the undesirable oxide defects 422 in the oxide layer. FIG. 4B illustrates the oxide defects occurring in the logic region after HF release. Compared to the conventional MEMS device, the etch stop layer 25 of the embodiment provides a structure with good stiffness and highly resistant to HF etching, thereby stopping the permeation of the etching solution and effectively preventing the oxide defects occurring in the logic region after HF release. Practically, but not limitedly, the material with better stiffness can be selected for making the carbon-containing layer 252. In one embodiment, the nitride layer 251 of the etching stop layer 25 has a first stiffness, the carbon-containing layer 252 of the etching stop layer 25 has a second stiffness, and the second stiffness is larger than the first stiffness. For example, the nitride layer 251 made of $Si_3N_4$ has a Young's Modulus of 260 GPa, while the etching stop layer 25 made of SiC has a Young's Modulus of 450 GPa.

Figure 5:
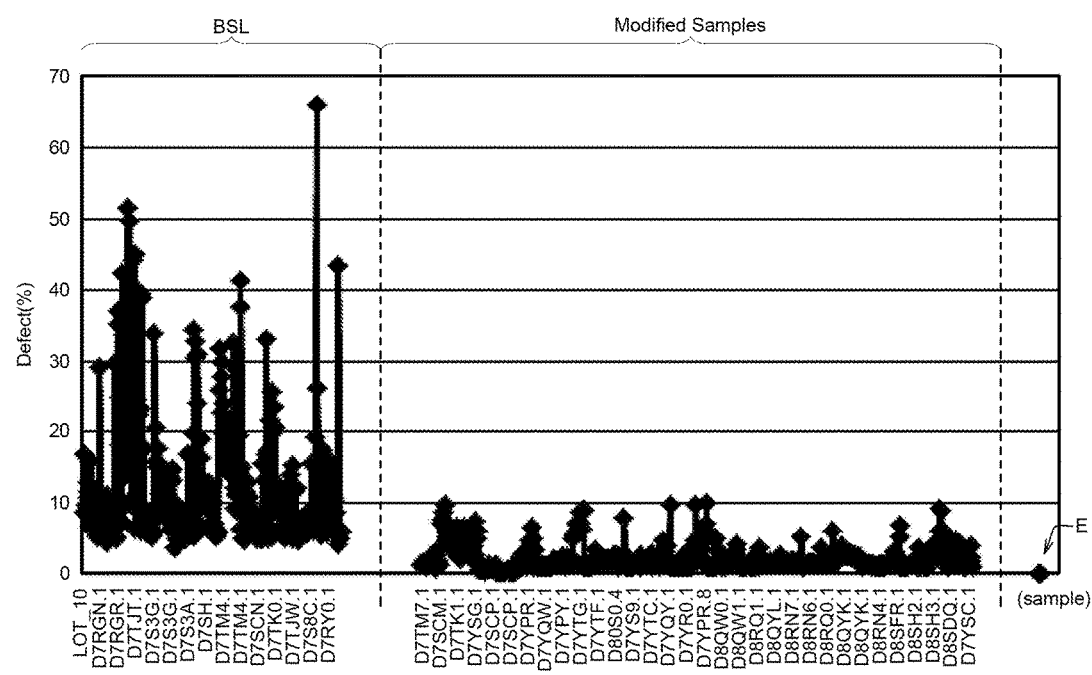
FIG. 5 shows results of defect examinations in the experiments.

FIG. 5 shows results of defect examinations in the experiments. In the experiments, three groups of samples are provided for defect examinations. Results of base-line samples (i.e. only SiN passivation layer, no etching stop layer 25 of the embodiment being formed within the logic area) are presented in the left-part of FIG. 5, which show about 15% of defect for most of samples and over 30% of defect for some samples. Results of modified samples (i.e. only SiN passivation layer, no etching stop layer 25 of the embodiment being formed within the logic area, but the manufacturing conditions are adjusted) are presented in the middle-part of FIG. 5, which show about 5% of defect for the most samples and about 10% of defect for some samples. Result of the sample with embodied design (i.e. etching stop layer 25 formed within the logic area) is presented in the right-part of FIG. 5, which show about 0.7% of defect. Accordingly, the experimental results have indicated that without the etching stop layer of the embodiment, the defect can only be reduced to about 5% when the manufacturing conditions such as the choking conditions of the manufacturing tool and the stress of the films are adjusted as perfect as possible. Thus, it is proved that the defects can be significantly reduced from 15% (or 5%) to 0.7% by adopting the design of the embodiment.

Figure 6:
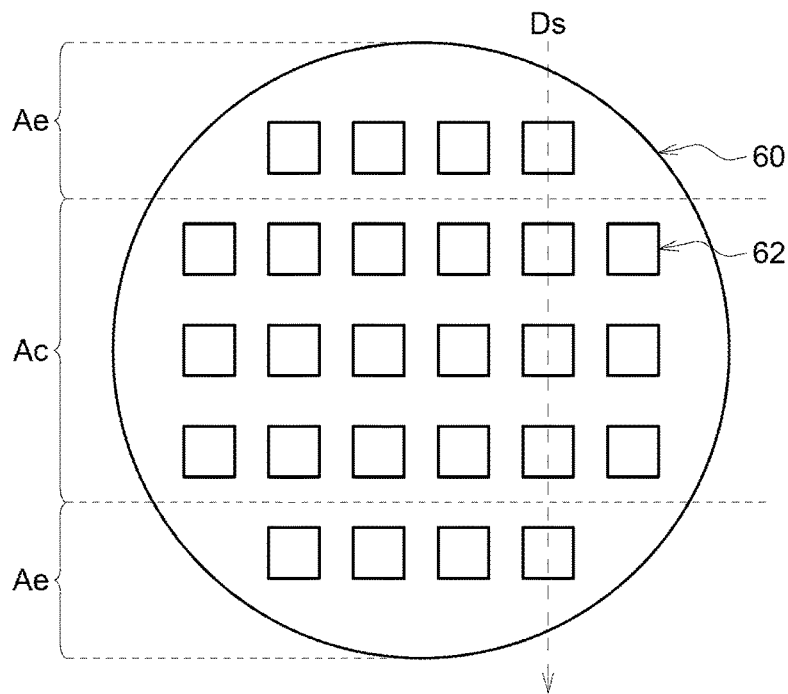
FIG. 6 is a simple drawing of plural MEMS devices on a wafer.

Moreover, in the experiments, the conditions of the related layers of the samples, such as the thickness the SiN passivation layer 43 of the conventional MEMS device and the thickness the etch stop layer 25 of the embodiment, are also examined. According to the experimental results, it is found that the thickness of the SiN passivation layer 43 of a conventional MEMS device is loss in a considerable amount after HF release; for example, the SiN passivation layer 43 has an original thickness of 10 k, but reduced to only 5 k after HF release. However, there is no thickness loss of the etch stop layer 25 of the embodiment, including the carbon-containing layer 252 (having the thickness t2, as shown in FIGS. 1 and 2) and the nitride layer 251 (having the thickness t1, as shown in FIGS. 1 and 2). Also, compared to the conventional MEMS devices, the embodied MEMS devices at the edge area and the center area of the wafer have uniform thickness of related layer(s)(i.e. no thickness difference). FIG. 6 is a simple drawing of plural MEMS devices 62 on a wafer 60. In the examination, it is found that the nitride layers 251 of the etch stop layers 25 of the embodied MEMS devices 62 at the edge area $A_e$ and the center area $A_c$ of the wafer 60 have substantially the same thickness (ex: t1 in FIGS. 1 and 2), and the carbon-containing layers 252 of the embodied MEMS devices 62 at the edge area $A_e$ and the center area $A_c$ of the wafer 60 also have substantially the same thickness (ex: t2 in FIGS. 1 and 2). Accordingly, the wafer bending situation has eased by the embodied design.

Figure 7:
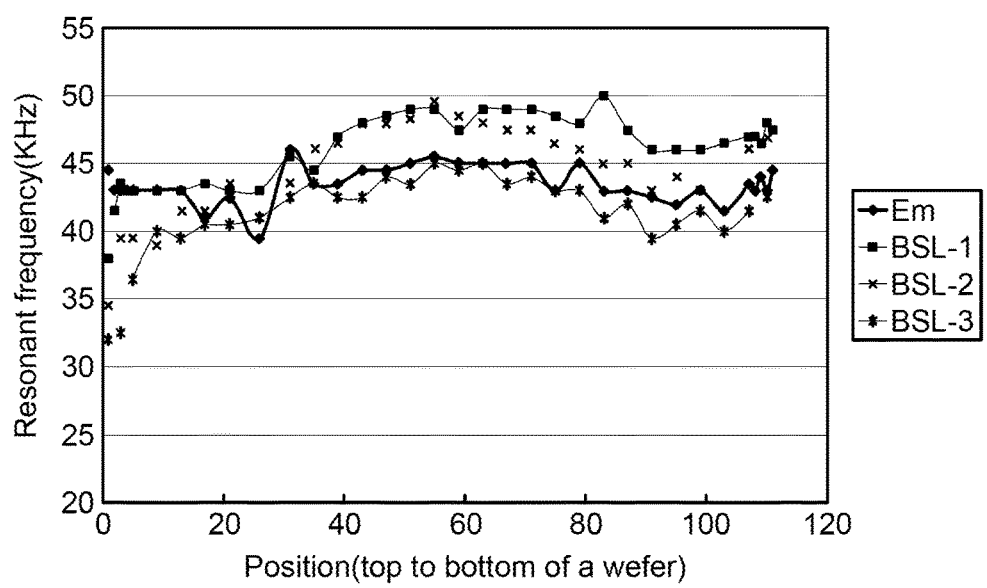
FIG. 7 shows the improvement of resonant frequency (RF) uniformity achieved by the embodied MEMS devices on a wafer.

Additionally, examination of resonant frequencies (RF) of the MEMS devices 62 on the wafer 60 is conducted. As shown in FIG. 6, the MEMS devices 62 on the wafer 60 can be examined along the scanning direction Ds. FIG. 7 shows the improvement of resonant frequency (RF) uniformity achieved by the embodied MEMS devices on a wafer. In FIG. 7, the curve Em represents the RF of the embodied MEMS devices on a wafer, and the curves BSL-1 to BSL-3 represent the RF of the conventional MEMS devices on a wafer. The results indicate that the RF uniformity of the embodied MEMS devices 62 on the entire wafer 60 is pretty good. In the embodiment, a variation in resonant frequencies (RF) of the embodied MEMS devices on the entire wafer is no more than (or less than) 10%. According to the experimental results, a variation in resonant frequencies (RF) of the embodied MEMS devices 60 on the entire wafer 62 can be maintained in a range substantially no more than (or less than) 5%.

According to the aforementioned descriptions, an etching stop layer 25 comprising a nitride layer 251 and a carbon-containing layer 252 formed on the nitride layer 251 is provided in the logic region of the MEMS device. In the embodied design, the carbon-containing layer 252 is an extremely low HF etching rate stop layer. Accordingly, for a single MEMS device, the defects (ex: occurring at the sacrificial layer such as the oxide layer) can be significantly reduced (ex: from 15% down to 0.7%) after HF release. For an entire wafer, the wafer bending situation can be eased, and the resonant frequencies of the embodied MEMS devices on the edge to the center of the wafer have great uniformity. The variation in resonant frequencies of the embodied MEMS devices on the entire wafer are no more than (or less than) 10%, even no more than (or less than) 5%. Thus, the proposed structure of the present embodiments not only effectively prevents the defects in each single MEMS device, but also significantly improves RF uniformity of the MEMS devices on the entire wafer. Additionally, the embodied design is compatible with the current fabrication process of the MEMS devices, which is suitable for mass production.

Other embodiments with different configurations of known elements in the MEMS device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, having a plurality of micro-electro-mechanical system (MEMS) devices, and one of the plurality of MEMS devices comprising:
    a substrate having a first region and a second region;
    a membrane structure formed in the first region and positioned correspondingly to a cavity of the substrate;
    a logic device formed in the second region, and electrically connected to the membrane structure;
    an interconnection structure formed in the second region, and the interconnection structure formed on the substrate and covering the logic device; and
    an etching stop layer formed in the second region, and the etching stop layer formed on the interconnection structure and comprising a nitride layer and a carbon-containing layer formed on the nitride layer, wherein the nitride layer of the etching stop layer has a first stiffness, the carbon-containing layer of the etching stop layer has a second stiffness, and the second stiffness is larger than the first stiffness,
    wherein the membrane structure in the first region is positioned correspondingly between the substrate and the etching stop layer in the second region.

2. The semiconductor structure according to claim 1, wherein the carbon-containing layer is made by at least a material of silicon carbide (SiC), silicon oxycarbide (SiOC), or silicon carbonitride (SiCN).

3. The semiconductor structure according to claim 1, wherein the carbon-containing layer is a single layer or a multi-layer.

4. The semiconductor structure according to claim 1, wherein the carbon-containing layer comprises a silicon carbonitride (SiCN) layer and a silicon carbide (SiC) layer.

5. The semiconductor structure according to claim 1, wherein the carbon-containing layer has a thickness ranged from 200 Å to 1000 Å.

6. The semiconductor structure according to claim 1, wherein the first region comprises:
a first electrode structure, comprising a plurality of perforated holes; and
the membrane structure positioned oppositely to the first electrode structure, and the membrane structure configured as a second electrode structure,
wherein the first electrode structure and the membrane structure in the first region are positioned correspondingly between the substrate and the etching stop layer in the second region.

7. The semiconductor structure according to claim 1, wherein a variation in resonant frequencies of the plurality of MEMS devices is less than 10%.

8. The semiconductor structure according to claim 1, wherein a variation in resonant frequencies of the plurality of MEMS devices is no more than 5%.

9. The semiconductor structure according to claim 1, wherein the nitride layers of the plurality of MEMS devices have substantially the same thickness.

10. A semiconductor structure with a plurality of micro-electro-mechanical system (MEMS) devices on a substrate, and each of the plurality of MEMS devices having an etching stop layer comprising a nitride layer and a carbon-containing layer formed on the nitride layer, wherein the carbon-containing layer is made by at least a material of silicon carbide (SiC), silicon oxycarbide (SiOC), or silicon carbonitride (SiCN), wherein a variation in resonant frequencies of the plurality of MEMS devices is less than 10%.

11. The semiconductor structure according to claim 10, wherein the variation in resonant frequencies of the plurality of MEMS devices is no more than 5%.

12. The semiconductor structure according to claim 10, wherein in each of the plurality of MEMS devices, the substrate has a first region and a second region, and said MEMS device comprises:
a membrane structure formed in the first region and positioned correspondingly to a cavity of the substrate;
a logic device formed in the second region, and electrically connected to the membrane structure;
an interconnection structure formed in the second region, and the interconnection structure formed on the substrate and covering the logic device; and
the etching stop layer formed in the second region, and the etching stop layer formed on the interconnection structure.

13. The semiconductor structure according to claim 12, wherein the first region comprises:
a first electrode structure, comprising a plurality of perforated holes; and
the membrane structure positioned oppositely to the first electrode structure, and the membrane structure configured as a second electrode structure,
wherein the first electrode structure and the membrane structure in the first region are positioned correspondingly between the substrate and the etching stop layer in the second region.

14. The semiconductor structure according to claim 10, wherein the carbon-containing layer is a single layer or a multi-layer.

15. The semiconductor structure according to claim 14, wherein the carbon-containing layer comprises a silicon carbonitride (SiCN) layer and a silicon carbide (SiC) layer.

16. The semiconductor structure according to claim 10, wherein the nitride layer of the etching stop layer has a first stiffness, the carbon-containing layer of the etching stop layer has a second stiffness, and the second stiffness is larger than the first stiffness.

17. The semiconductor structure according to claim 10, wherein the carbon-containing layer has a thickness ranged from 200 Å to 1000 Å.

18. The semiconductor structure according to claim 10, wherein the nitride layers of the plurality of MEMS devices have substantially the same thickness.

* * * * *